(12) United States Patent
Berse

(10) Patent No.: US 7,759,574 B2
(45) Date of Patent: Jul. 20, 2010

(54) SHEET METAL HOUSING

(75) Inventor: Andreas Berse, Haltern (DE)

(73) Assignee: ABB AG, Mannheim (DE)

(*) Notice: Subject to any disclaimer, the term of this patent is extended or adjusted under 35 U.S.C. 154(b) by 472 days.

(21) Appl. No.: 11/792,319

(22) PCT Filed: Dec. 5, 2005

(86) PCT No.: PCT/EP2005/012988

§ 371 (c)(1),
(2), (4) Date: Jun. 5, 2007

(87) PCT Pub. No.: WO2006/061163

PCT Pub. Date: Jun. 15, 2006

(65) Prior Publication Data

US 2007/0261873 A1 Nov. 15, 2007

(30) Foreign Application Priority Data

Dec. 7, 2004 (DE) .................. 20 2004 018 857 U

(51) Int. Cl.
*H02G 3/08* (2006.01)
*H05K 5/04* (2006.01)
(52) U.S. Cl. .................. 174/50; 174/520; 174/559; 174/560; 220/3.2; 220/4.02; 312/223.1; 312/350
(58) Field of Classification Search .................. 174/480, 174/481, 50, 53, 57, 58, 520, 489, 500, 17 R, 174/66, 67, 559, 560, 561; 220/3.2–3.9, 220/4.02, 241, 242, 4.01; 312/350, 223.1, 312/223.2, 223.3, 223.6, 263, 264, 265.5
See application file for complete search history.

(56) References Cited

U.S. PATENT DOCUMENTS

| | | | | |
|---|---|---|---|---|
| 4,111,328 A | * | 9/1978 | Eggert et al. | 220/4.01 |
| 5,398,833 A | * | 3/1995 | Klauss et al. | 220/4.02 |
| 6,005,188 A | * | 12/1999 | Teichler et al. | 174/50 |
| 6,024,426 A | * | 2/2000 | Korinsky et al. | 312/265.5 |
| 6,041,956 A | * | 3/2000 | Kao | 220/4.02 |
| 6,450,597 B1 | | 9/2002 | Bell et al. | |
| 2002/0044430 A1 | | 4/2002 | Negishi | |

FOREIGN PATENT DOCUMENTS

| DE | 42 39 485 C1 | 6/1994 |
|---|---|---|
| WO | 00/21348 | 4/2000 |

OTHER PUBLICATIONS

PCT/ISA/210 for PCT/EP2005/012988 dated Apr. 19, 2006.
International Preliminary Report on Patentability for PCT/EP2005/012988.

* cited by examiner

*Primary Examiner*—Angel R Estrada
(74) *Attorney, Agent, or Firm*—Buchanan Ingersoll & Rooney PC

(57) ABSTRACT

A sheet metal housing is disclosed for housing measurement and control devices. The sheet metal housing comprises a cover plate, a baseplate, two lateral walls and a back wall, to accommodate rail-mounted, plug-in modules, the front panels of which are embodied to together form a closed front. The housing can be made up of two identical, essentially C-shaped housing shells and the back wall. The cover plate and the baseplate are both of double-wall construction and can form an inner and an outer plate, separated from each other, whereby the inner plates comprise means for accommodating guide rails. Each inner plate and each outer plate of opposing walls can be components of the same housing shell.

15 Claims, 5 Drawing Sheets

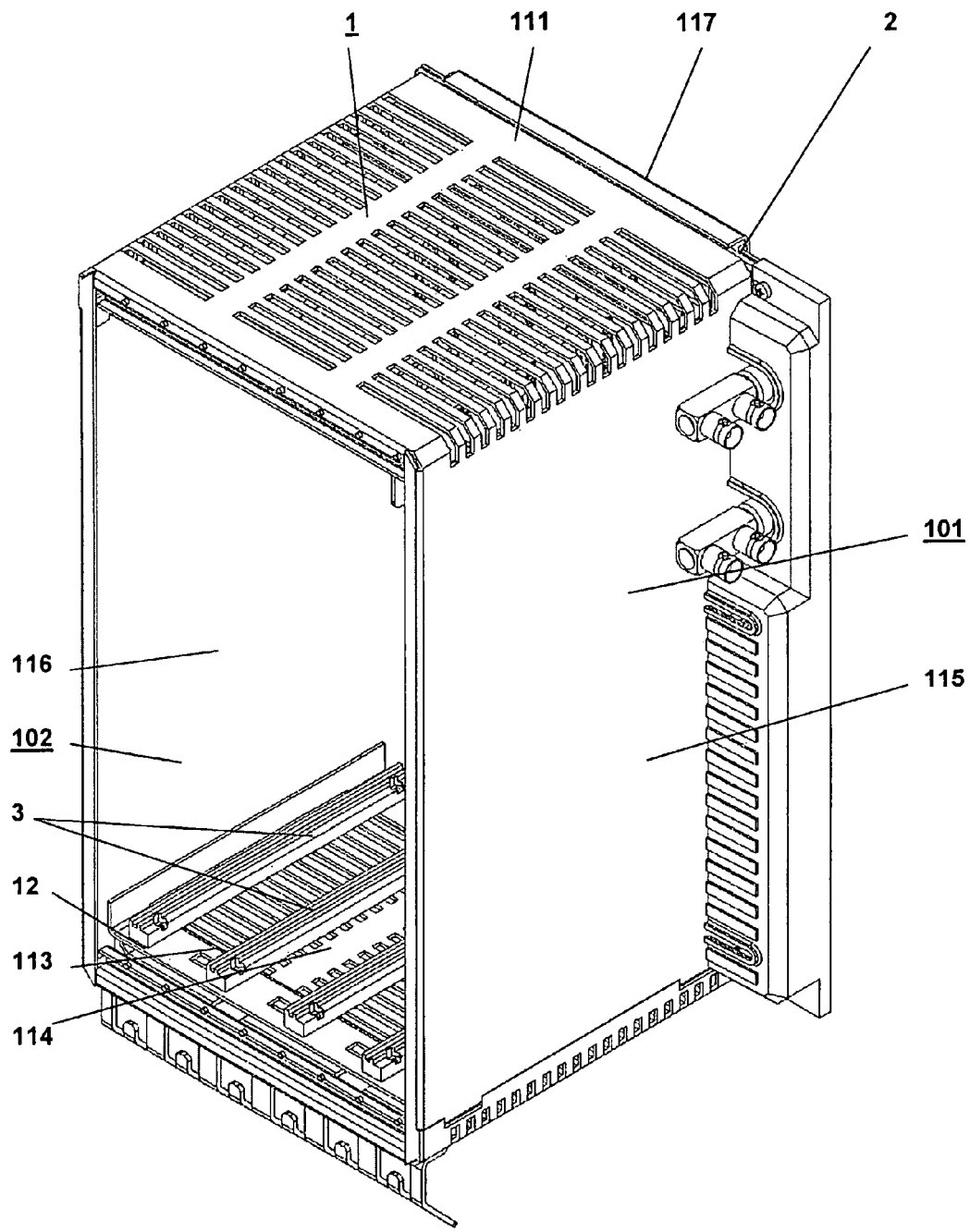
Figur 1

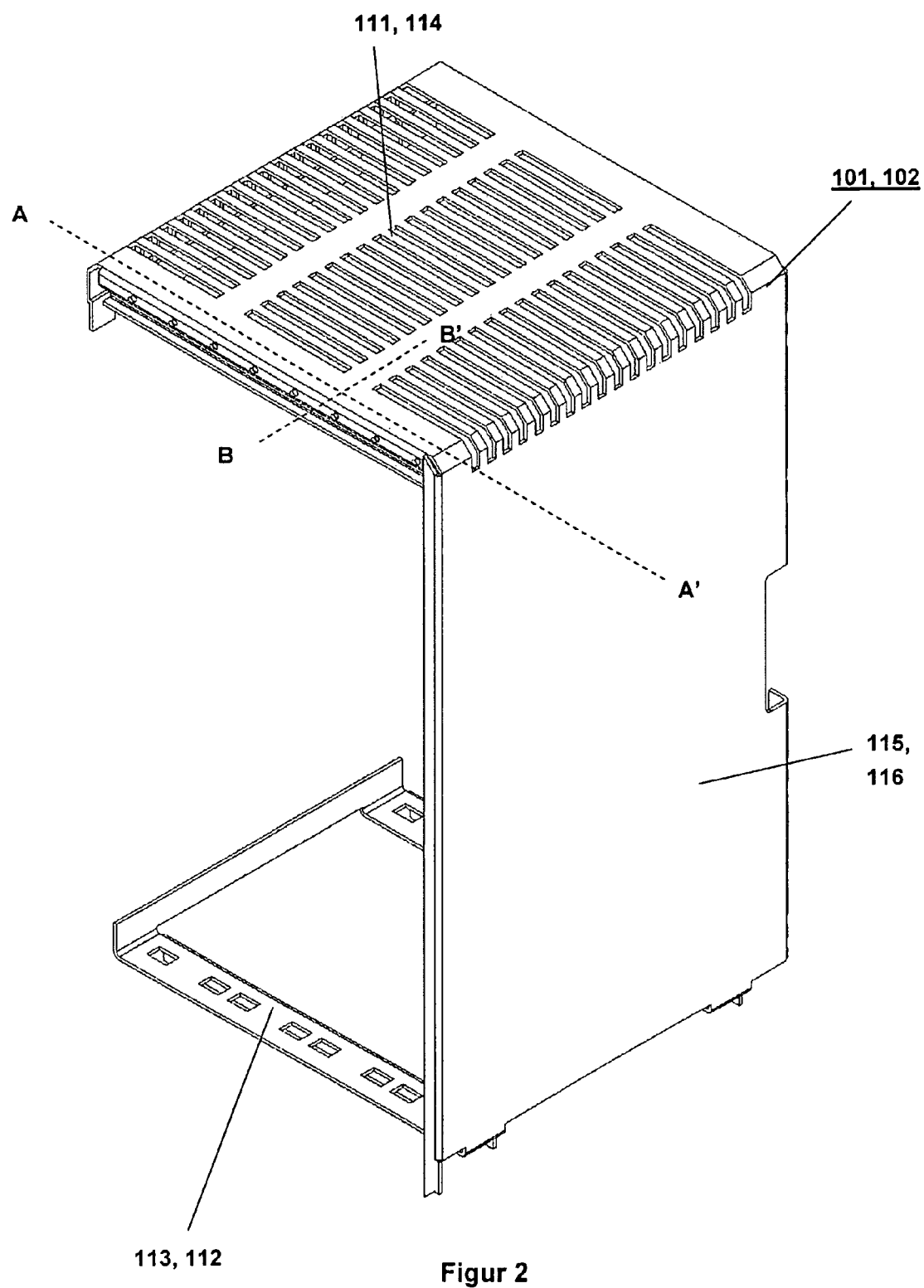
Figur 2

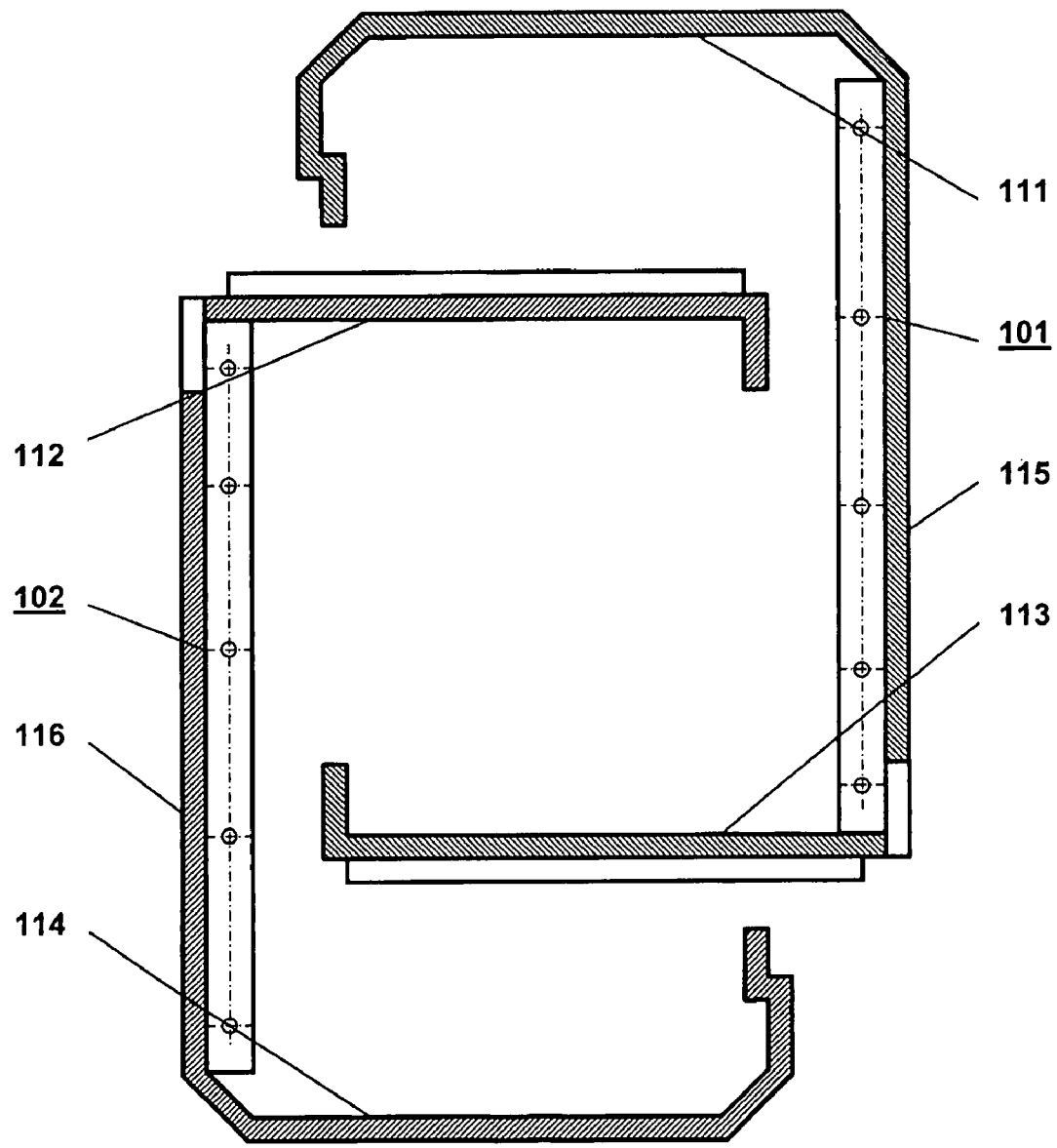
Figur 3

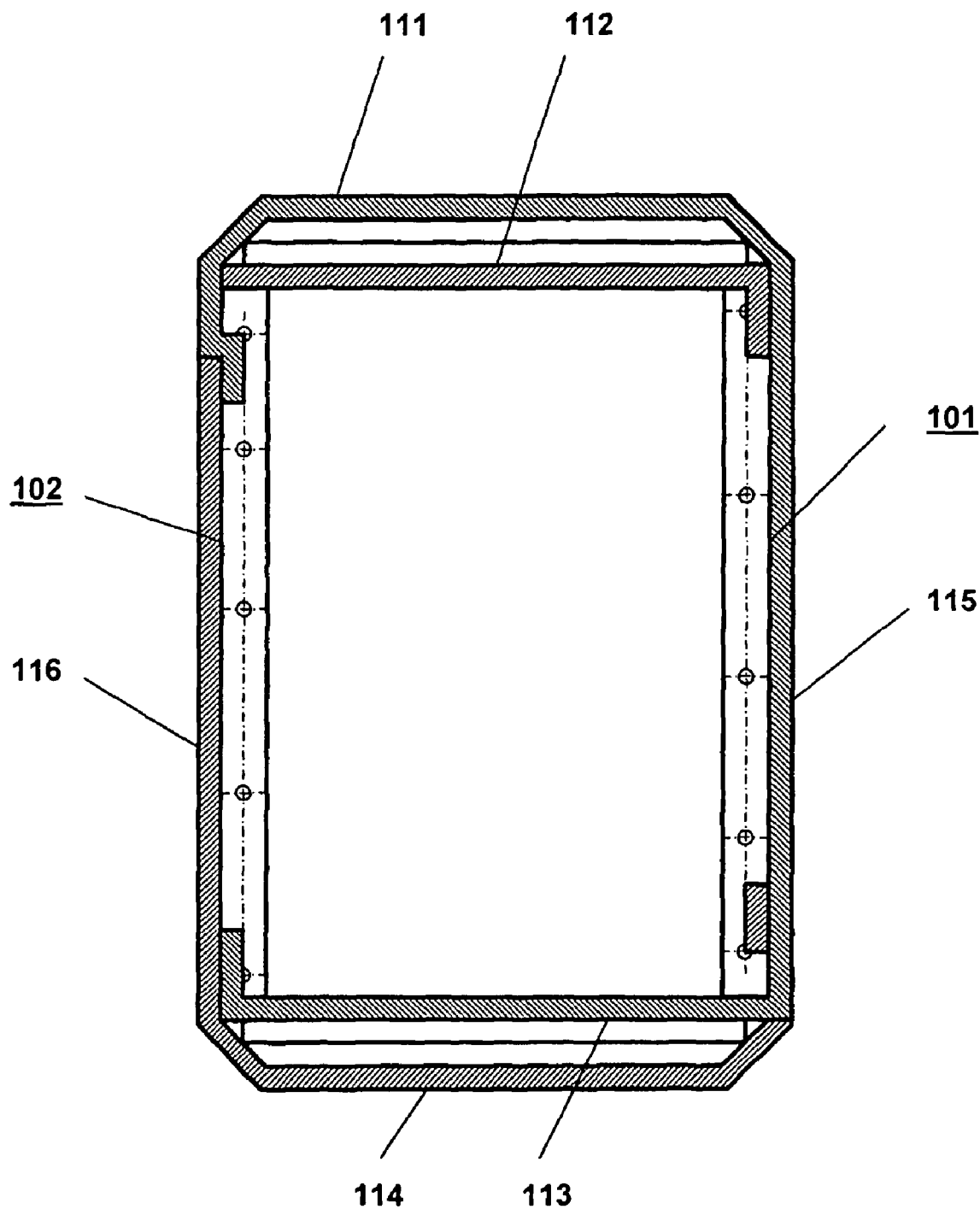
Figur 4

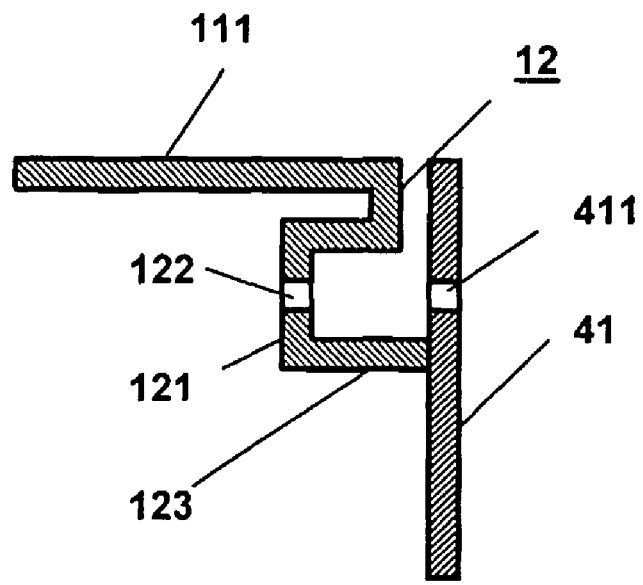
Figur 5
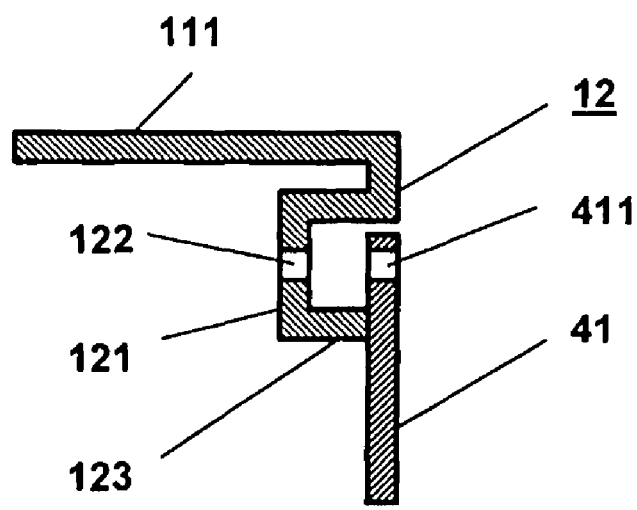
Figur 6

SHEET METAL HOUSING

The invention relates to a sheet metal housing for receiving measuring and control devices, comprising a cover plate, a base plate, two lateral walls and a back wall, for receiving rail-mounted plug-in modules whereof the front plates are suitable for together forming a closed front.

Housings of this kind are known as holders in so-called 19" technology from prior public use. Here, the housing comprises a plurality of individual parts which entail considerable expense for storage and assembly.

Moreover, DE 42 39 485 discloses a sheet metal housing for measuring and control units, for installation in a cutout in a switch cabinet, which comprises two identical U-shaped half shells of constant material thickness. In the assembled condition, the limbs of each half shell overlap such that they lie on top of one another in double-walled manner. The type of construction of this sheet metal housing means it is not suitable for receiving rail-mounted plug-in modules.

The object of the invention is to provide a housing for receiving rail-mounted plug-in modules that comprises few parts and is simple to assemble.

According to the invention, this object is achieved by a sheet metal housing having the features of claim 1. Advantageous embodiments of the invention are specified in the claims that refer back to this.

The invention takes as its starting point a sheet metal housing for receiving measuring and control devices, comprising a cover plate, a base plate, two lateral walls and a back wall, for receiving rail-mounted plug-in modules whereof the front plates are suitable for together forming a closed front.

According to the invention, the housing is composed of two identical, substantially C-shaped housing shells and the back wall. The cover plate and the base plate are each of double-walled construction so that they each form an inner and an outer plate which are spaced from one another, with the respectively inner plate having means for receiving guide rails. The respectively inner plate and the respectively outer plate of the opposing wall are part of the same housing shell.

Accordingly, one of the housing shells forms a lateral wall, the inner cover plate and the outer base plate; and the other housing shell forms a lateral wall, the outer cover plate and the inner base plate. This substantially cuboid structure is closed at the back by a back wall. The housing that is formed in this way is open at the front in order to receive rail-mounted plug-in modules whereof the front plates together form a closed front side.

The housing substantially comprises three parts, of which two parts are identical bent parts, plus the joining parts. Advantageously, the expense of storage is very low. Moreover, the housing easy to assemble and comparatively lightweight.

Further features and advantages of the invention will be explained in more detail below with reference to an exemplary embodiment. In the drawings that are required for this:

FIG. 1 shows a perspective illustration of a housing,

FIG. 2 shows a perspective illustration of a housing shell,

FIG. 3 shows an exploded illustration, partly in section, of two housing shells, FIG. 4 shows an illustration, partly in section, of two housing shells engaging in one another, FIG. 5 shows a detail illustration of a stop strip, and FIG. 6 shows a detail illustration of an alternative stop strip.

FIG. 1 shows, in perspective illustration, a sheet metal housing 1 which is structured in accordance with the features of the invention. The sheet metal housing 1 substantially comprises two identical housing shells 101 and 102 and a back wall 117. In the forwardly open sheet metal housing 1, the two housing shells 101 and 102 form the two lateral walls 115 and 116 and the base plate 113/114 and the cover plate 111/112. The base plate 113/114 and the cover plate 111/112 are each of double-walled construction, in that they form an inner and an outer plate in each case, 112 and 114, and 111 and 113, which are spaced from one another, with the inner plate 112 and 114 in each case being perforated at the base and cover to receive guide rails 3 which can be snap-fit in place.

The sheet metal housing 1 is closed off at the back by a back wall 117. A printed circuit board 2 is inserted between the back wall 117 and the two housing shells 101 and 102. The printed circuit board 2 serves to provide an electrical connection to the plug-in modules, which may be pushed in from the front and are not illustrated. Moreover, it may be provided for the printed circuit board 2 to be equipped with electrical and/or electromechanical components.

A stop strip 12 is integrally formed on the outer base plate 114 and the outer cover plate 111 respectively.

FIG. 2 shows a housing shell 101 in perspective illustration. The other housing shell 102 is of identical construction. Of the reference numerals which are given in pairs, the first reference numeral in each case belongs with the housing shell 101 and the second reference numeral in each case belongs with the housing shell 102. The housing shell 101 is a sheet metal part which is bent in a number of places and is substantially C-shaped. Here, the opposing limbs form, respectively, a cover plate 111 and a base plate 113, which are connected to one another by way of a lateral wall 115, and an inner and an outer plate.

Referring back now to the illustration in FIG. 1, the first housing shell 101 forms the lateral wall 115, the outer cover plate 111 and the inner base plate 113. The second housing shell 102 forms the side wall 116, the inner cover plate 112 and the outer base plate 114. The respectively inner plates 112 and 114 and the respectively outer plates 111 and 113 of the opposing wall are thus part of the same housing shell, 101 and 102.

The respectively inner plate, that is to say the inner base plate 113 of the housing shell 101 and the inner cover plate 112 of the housing shell 102, is constructed in the manner of a frame. Moreover, these inner plates have perforations for receiving guide rails 3 which can be snap-fit in place.

The cover plate 111 and the base plate 113 of the housing shell 101 each have, at the side remote from the lateral wall 115, an angled tab. In the assembled condition, these tabs are joined to the lateral wall 116 of the housing shell 102. In a preferred embodiment, the tabs of the one housing shell are spot-welded to the lateral wall of the other housing shell. In an alternative embodiment, the tabs of the one housing shell are press-fit to the lateral wall of the other housing shell.

In FIG. 3, which uses like reference numerals for like means, two housing shells are illustrated in exploded view and in section along the line of section A-A' in FIG. 2. The two housing shells 101 and 102 that are shown are rotated out of their similar position, through 180 degrees in relation to one another. In accordance with this, the outer plate of the housing shell 101 is the outer cover plate 111 and the inner plate is the inner base plate 113. The outer plate of the housing shell 102 is the outer base plate 114 and the inner plate is the inner cover plate 112.

In FIG. 4, which uses like reference numerals for like means, the housing shells 101 and 102 which are illustrated in exploded view in FIG. 3 are combined to form a housing carcass.

In FIG. 5, a detail along the line of section B-B' in FIG. 2 is illustrated in a first embodiment. In accordance with this, a substantially S-shaped stop strip 12 is integrally formed on the outer cover plate 111. The stop strip 12 is constructed such that it secures rail-mounted plug-in modules, with the module having a front plate 41 which may be connected to the stop strip 12 by means of a screw (which is not illustrated).

The stop strip 12 has a limb 121 which is remote from the front side. This limb 121 is equipped with threaded bores 122. The threaded bores 122 are arranged to correspond with bores 411 in the front plate 41 of the plug-in module.

Moreover, the stop strip 12 has an inner limb 123 which is arranged parallel to the cover plate 111. This limb 123 projects beyond the front housing plane. The front plate 41 of the plug-in module lies on the end face of the limb 123. The end face of the limb 123 is made of bare metal and is galvanically connected to the front plate 41 of the plug-in module.

The outer base plate 114 has a similar stop strip 12 whereof the form and shape provide a vertical mirror image to the illustration in FIG. 5.

FIG. 6 illustrates, as a detail along the line of section B-B' in FIG. 2, and using like reference numerals for like means, an alternative embodiment of a stop strip 12. Unlike the stop strip 12 in accordance with FIG. 5, the inner limb 123, which is arranged parallel to the cover plate 111, is set behind the front housing plane by the thickness of the material of the front plate 41 of the plug-in module. The front plate 41 of the plug-in module ends flush with the front housing plane.

The outer base plate 114 has a similar stop strip 12 whereof the form and shape provide a vertical mirror image to the illustration in FIG. 6.

LIST OF REFERENCE NUMERALS

1 Housing
101, 102 Housing shell
111, 112 Cover plate
113, 114 Base plate
115, 116 Lateral wall
117 Back wall
12 Stop Strip
121, 123 Limb
122 Threaded bore
2 Printed Circuit Board
3 Guide Rail
4 Module
41 Front Plate
411 Bore

The invention claimed is:

1. A sheet metal housing for receiving measuring and control devices, comprising a cover plate, a base plate, two lateral walls and a back wall, for receiving rail-mounted plug-in modules whereof the front plates are suitable for together forming a closed front, wherein
the housing is comprised of two identical, substantially C-shaped housing shells and the back wall,
the cover plate and the base plate are each of double-walled construction so that they each form an inner and an outer plate which are spaced from one another to form a gap therebetween, with the respectively inner plate having means for receiving guide rails, and
the respectively inner plate and the respectively outer plate of the opposing wall are part of the same housing shell.

2. The sheet metal housing as claimed in claim 1, wherein the respectively inner plate of the cover plate and the base plate are constructed in the manner of a frame.

3. The sheet metal housing as claimed in claim 1, wherein a printed circuit board is inserted between the cuboid structure, which comprises two housing shells, and the back wall.

4. The sheet metal housing as claimed in claim 1, wherein a stop strip is integrally formed on the outer base plate.

5. The sheet metal housing as claimed in claim 1, wherein a stop strip is integrally formed on the outer cover plate.

6. The sheet metal housing as claimed in claim 4, wherein the stop strip is constructed such that it secures rail-mounted plug-in modules.

7. The sheet metal housing as claimed in claim 6, wherein the stop strip is constructed to be S-shaped and a limb which is remote from the front side is equipped with threaded bores.

8. The sheet metal housing as claimed in claim 7, wherein the side walls, the base plate and the cover plate end flush with the front side, and the inner limb of the stop strip projects beyond the front housing plane.

9. The sheet metal housing as claimed in claim 7, wherein the side walls, the base plate and the cover plate end flush with the front side, and the inner limb of the stop strip is set behind the front housing plane by the thickness of the material of the front plate of the rail-mounted plug-in modules.

10. The sheet metal housing as claimed in claim 8, wherein the inner limb of the stop strip is galvanically connected to the front plate of the rail-mounted plug-in modules.

11. The sheet metal housing as claimed in claim 3, wherein a stop strip is integrally formed on the outer base plate.

12. The sheet metal housing as claimed in claim 4, wherein a stop strip is integrally formed on the outer cover plate.

13. The sheet metal housing as claimed in claim 5, wherein the stop strip is constructed such that it secures rail-mounted plug-in modules.

14. The sheet metal housing as claimed in claim 9, wherein the inner limb of the stop strip is galvanically connected to the front plate of the rail-mounted plug-in modules.

15. A sheet metal housing for receiving measuring and control devices, comprising:
a cover plate and a base plate, the cover plate and the base plate each being of double-walled construction forming an inner and an outer plate which are spaced from one another to form a gap therebetween, the respective inner plate being capable of receiving guide rails;
two lateral walls; and
a back wall, wherein the devices are plug-in modules for rail-mounting.

* * * * *